United States Patent [19]

Gallegro et al.

[11] Patent Number: 5,319,375

[45] Date of Patent: Jun. 7, 1994

[54] SEGMENTED PLANAR NEAR-FIELD ANTENNA TESTING

[75] Inventors: Gondolfo F. Gallegro; Donald Kerbs, both of East Northport, N.Y.

[73] Assignee: Grumman Aerospace Corporation, Bethpage, N.Y.

[21] Appl. No.: 945,708

[22] Filed: Sep. 16, 1992

[51] Int. Cl.⁵ .............................................. G01S 7/40
[52] U.S. Cl. .................................... 342/165; 342/360
[58] Field of Search ............................... 342/165, 360

[56] References Cited

U.S. PATENT DOCUMENTS 4,453,164  6/1984  Patton .................................. 342/360
4,800,387  1/1989  Joy ..................................... 342/165
4,954,834  9/1990  Buck .................................... 342/360

Primary Examiner—T. H. Tubbesing
Attorney, Agent, or Firm—Pollock Vande Sande & Priddy

[57] ABSTRACT

Measurement of the transfer function of a space fed lens array antenna membrane is achieved by utilizing a low power test illumination antenna opposite the feed side, while a probe antenna undergoes raster scanning of a test window on an opposite target side. The probe antenna measures near field distribution on the target side and data developed enables the transfer function of the membrane to be measured.

10 Claims, 2 Drawing Sheets

SEGMENTED PLANAR NEAR-FIELD ANTENNA TESTING

FIELD OF THE INVENTION

The present invention relates to measuring and testing systems, and more particularly to such systems for near-field antenna measurements.

BACKGROUND OF THE INVENTION

Space-fed antenna arrays are currently used in radar and communications applications. They enjoy particular advantage over other antenna types (corporate-fed arrays or reflector systems) when requirements demand very large aperture size. In fact, this class of antenna may assume lengths of over two hundred feet when deployed for space usage. They can be rolled in "window-shade" fashion while stowed, for transportation into orbit or during storage on Earth, and then can be unrolled when needed as a radiating device.

Usually, when these space-fed lens antennas are designed for a space mission, they must be extremely light to permit their efficient transport from Earth to orbit altitudes. In addition, their construction will not permit a total unrolling and deployment under the influence of the Earth's gravitational force. The array would become seriously deformed, and unless it were supported might destroy itself. Herein resides the motivation for this invention. Since the array cannot be fully opened on Earth, how can it be tested before an expensive launch into orbit? Conventional far-field, near-field, and focused near-field testing approaches all require a fully opened antenna to test. This invention, on the other hand, tests one "exposed" portion of the array at a time, as the array is unrolled from one "window-shade" canister onto another "window-shade" canister.

BRIEF DESCRIPTION OF THE PRESENT INVENTION

The present invention offers a testing solution by measuring the near-field performance of the entire lens-membrane-aperture in a segmented way. A membrane transfer function is obtained using nearfield measurement techniques and use is made of this transfer function to compute lens far-field patterns. The actual feed system is not used during this segmented testing for two reasons: (1) it would have to be located hundreds of feet away from the membrane to assume its correct operational position, and (2) the membrane would have to be completely deployed for this feed system to provide effective illumination. A test illumination antenna is used as the feed-system surrogate during segmented testing. It illuminates a significant number of array elements on one side of the membrane, while elements on the other side are "individually" examined using a near-field probe antenna. Windows within exposed portions of the membrane are tested in this fashion. As testing is completed on one exposed test window, the window is rolled onto a window-shade canister, thereby exposing another portion from the other canister. This newest exposed portion is tested and the procedure is repeated until a transfer function is obtained for all membrane elements.

Although the invention specifically discusses the testing of space-fed lens arrays as they are rolled and unrolled, the approach could easily apply to the testing of large corporate-fed arrays using other deployment mechanizations.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
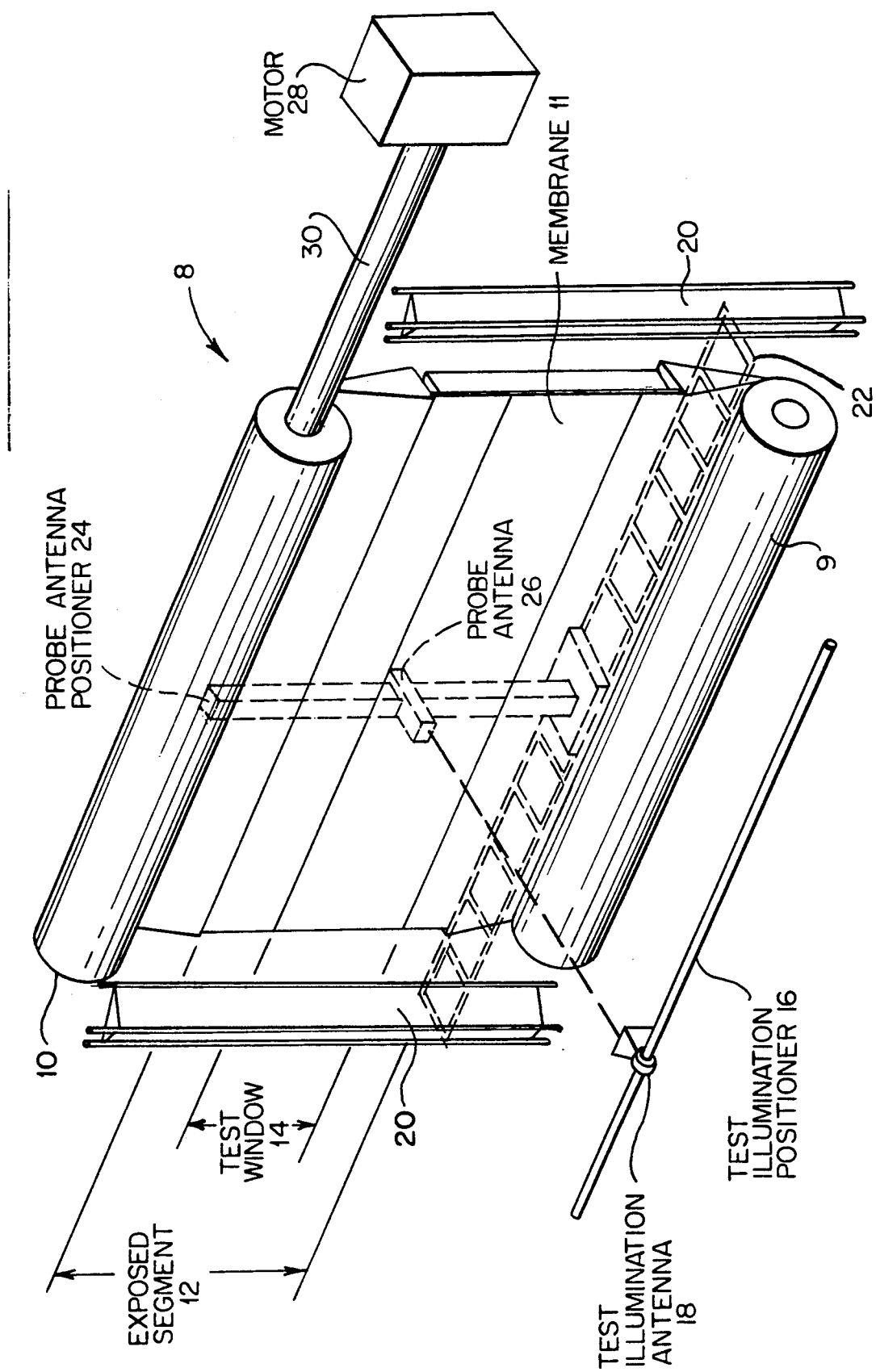
FIG. 1 is a simplified perspective view of the present pattern measurement system.

Referring to FIG. 1, a partially unfurled space fed lens array is indicated by reference numeral 8. Since a space-fed lens antenna is well known in the prior art, it is not, per se, part of the present invention. Rather, it is the measurement and testing set-up operating upon such an antenna which constitutes the invention. Top and bottom canisters 10 and 9 receive the supply and take up ends of the antenna membrane while a relatively small exposed segment 12 is maintained in a planar condition. The main body of the antenna includes a membrane 11 which incorporates an intermediate ground plane and elements on the feed and target side as indicated in FIG. 2.

During a particular interval of time, a test window 14, smaller than the exposed segment 12, is perpendicularly oriented to an axis defined between a test illumination antenna 18 and a probe antenna 26. In accordance with the present invention, the test illumination antenna 18, illuminates groups of feed-side elements in the test window. The probe antenna 26, performs raster scan movement so that it can pick up signals transmitted by target side elements which reside within the illuminated feed side test window.

In FIG. 1, test illumination antenna 18 is horizontally moveable along positioner 16. The antenna elements on the feed side (near side) receive the illumination and transmit it to elements on the opposite (target) side. On this target side is a probe antenna 26 closely spaced to the surface of membrane 11 and mounted to a vertically oriented probe antenna positioner 24. This positioner is in turn mounted to a horizontally oriented positioner 22. The probe antenna 26 is mounted to the positioners 22 and 24 in much the same manner as an x-y plotter mechanism of conventional design. As the elements on the feed side of membrane 11 become illuminated the corresponding elements on the target side transmit signals to the probe antenna as the probe antenna performs a raster scan of a probe region. The resulting signals are processed to develop a transfer function of the antenna membrane that can be used for the design of a later realistic set-up, or the evaluation of a present configuration which is being prepared for launch into orbit.

Figure 2:
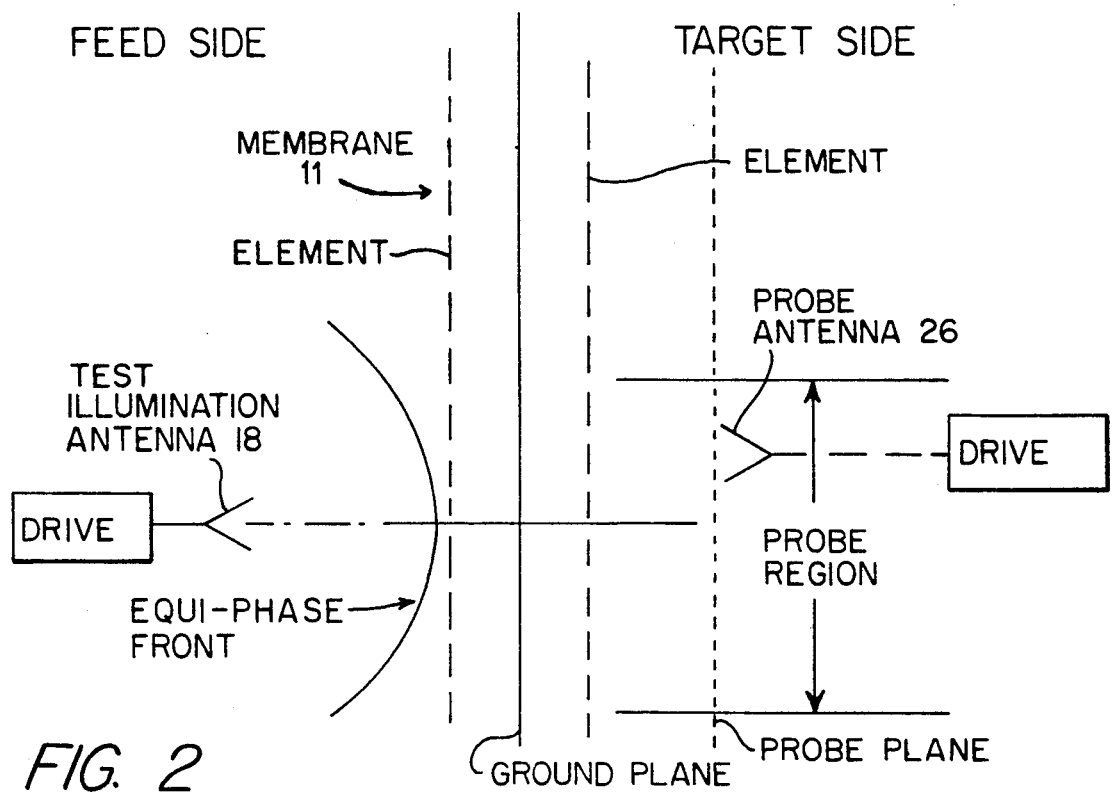
FIG. 2 is a schematic illustration of the invention with a test illumination antenna in a first position.

FIG. 2 illustrates the test illumination antenna 18 at a first position facing the feed side of the antenna membrane. The antenna 18 illuminates a group of feed side elements by transmitting a continuous microwave spherical wavefront (equi-phase). On the opposite side of the membrane 11 (target side) is the probe antenna which undergoes a raster scan of a preselected membrane area (probe region) which is a division of the test window 14 (FIG. 1). A typical distance between probe antenna and membrane is approximately 3λ. The probe antenna measures near field distribution on the target side within the probe region and in a typical test set-up probe increments can be set to approximately λ/3. The probe position should be accurately determined to better than ±λ/200. In order to accurately determine the antenna membrane's transfer function, sections of support structure 20 should be included around the test window so that the influence of reflections from such members will be accounted for.

Figure 3:
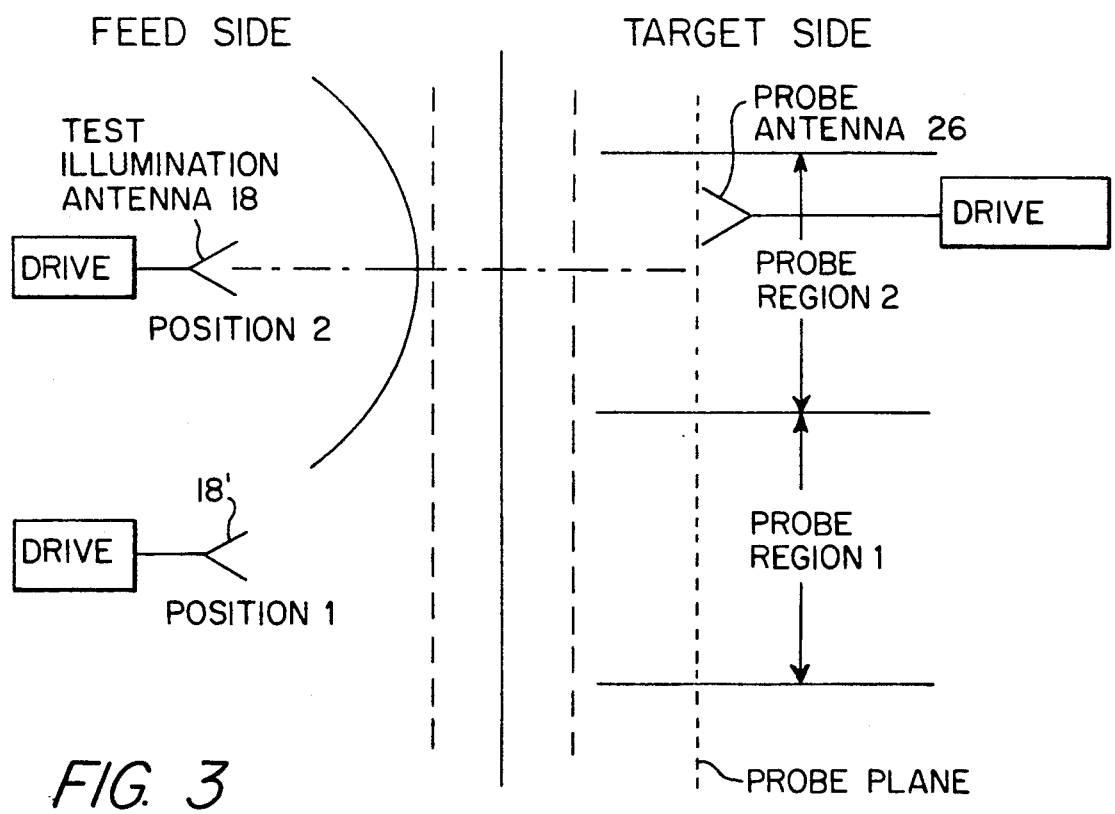
FIG. 3 is a schematic illustration of the invention with the test illumination antenna and the probe antenna in a second position.

After a probe antenna has completed its raster scan it is moved to a second probe region, as indicated in FIG. 3. A drive connected to the test illumination antenna 18 then moves this antenna to a second position, central to the probe region 2.

After the entire test window 14 is probed on a region by region basis, motor 28 (FIG. 1) is turned on so that the membrane 11 may be scrolled to expose an adjacent test window 14. Accordingly, the process of measurement is repeated until the entire membrane is probed region by region. Data storage occurs for each complex target side datum and respective probe location so that a transfer function for the antenna membrane may be developed.

In order to determine the membrane transfer function, phase shifters in the element modules (not shown) should be set to scan a beam toward a target-side angle in space and to focus on a point in space where an actual feed antenna will be positioned. Further design considerations for achieving precise data acquisition mandate that sufficient membrane be exposed outside the test window 14 to include element mutual coupling effects. Further, all representative seams, fold joints and supporting structure should be replicated.

By virtue of the present invention, including the determination of the membrane transfer function, design and testing of large space fed lens arrays is possible in the laboratory. With this function calculated, it is possible to determine actual antenna operating characteristics before future deployment.

It should be understood that the invention is not limited to the exact construction details shown and described herein; obvious modifications will occur to persons skilled in the art.

We claim:

1. A system for conducting segmented near field pattern measurements on the membrane of an antenna comprising:
   means for sequentially unrolling an exposed segment of the antenna membrane to subject a test window portion of the segment to measurements;
   a test illumination antenna positioned in confronting relation with a feed side of the membrane;
   a probe antenna positioned on an opposite side of the membrane, in confronting relation with a target side of the membrane;
   means for moving the probe antenna in a raster scan pattern relative to a region of the membrane, the region being smaller than the exposed segment;
   means for locating the illumination antenna opposite the center of each probe region for illuminating the region being probed;
   the moving and locating means respectively moving the probe and illumination antenna so that only a single region is fully illuminated and probed during a particular interval.

2. The system set forth in claim 1 wherein the locating means includes means for driving the illumination antenna horizontally between points defining centers of adjacent probed regions.

3. The system set forth in claim 1 wherein the moving means includes means for driving the probe antenna in a raster scan pattern symmetrical about a center of each probed region.

4. The system set forth in claim 1 together with:
   means for enclosing a non exposed segment of the membrane; and
   members adjacent lateral edges of the exposed segment replicating the effect of actual deployment structures which unroll the entire membrane in actual use.

5. The system set forth in claim 1 together with a motor for sequentially unrolling the membrane in lengths equal to the exposed segments until the entire membrane is scrolled.

6. A system for conducting segmented near field pattern measurements on the membrane of an antenna comprising:
   means for sequentially unrolling an exposed segment of the antenna membrane to subject a test window portion of the segment to measurements;
   a test illumination antenna positioned in confronting relation with a feed side of the membrane;
   a probe antenna positioned on an opposite side of the membrane, in confronting relation with a target side of the membrane;
   means for moving the probe antenna in a raster scan pattern relative to a region of the exposed segment, the moving means including means for driving the probe antenna in a raster scan pattern symmetrical about a center of each probed region;
   means for locating the illumination antenna opposite the center of each probe region for illuminating the region being probed, the locating means including means for driving the illumination antenna horizontally between points defining centers of adjacent probed regions;
   the moving and locating means respectively moving the probe and illumination antenna so that only a single region is fully illuminated and probed during a particular interval; and
   members adjacent lateral edges of the exposed segment replicating the effect of deployment structures which unroll the entire membrane in actual use.

7. The system set forth in claim 6 together with a motor for sequentially unrolling the membrane in lengths equal to the exposed segments until the entire membrane is scrolled.

8. A method for measuring a near field pattern of a space fed lens array antenna comprising the steps:
   exposing a segment of an antenna rolled membrane;
   defining a test window transversely across a portion of the segment;
   subjecting a probe antenna, on a target side of the antenna to a raster scanning pattern across a first preselected region of the test window;
   moving a test illumination antenna, on the feed side of the antenna, to a point aligned with the preselected region;
   sequentially moving the probe antenna to adjacent regions in the test window;
   correspondingly relocating the illumination antenna in alignment with the center of the adjacent region;

sequentially unrolling the membrane to probe substantially the entire surface of the membrane; and
collecting data from the probe antenna during sequential raster scans.

9. The method set forth in claim 8 wherein the probe antenna is positioned within several wavelengths of the membrane surface.

10. The method set forth in claim 8 wherein a continuous microwave radar signal, capable of generating generally spherical wavefronts, is emitted from the illumination antenna.

* * * * *